(12) United States Patent  (10) Patent No.: US 7,868,350 B2
Kim  (45) Date of Patent: Jan. 11, 2011

(54) NITRIDE SEMICONDUCTOR LIGHT-EMITTING DEVICE AND METHOD FOR MANUFACTURING THE SAME

(75) Inventor: Hee-Jin Kim, Gwangju-si (KR)

(73) Assignee: LG Innotek Co., Ltd., Seoul (KR)

( * ) Notice: Subject to any disclaimer, the term of this patent is extended or adjusted under 35 U.S.C. 154(b) by 349 days.

(21) Appl. No.: 11/707,924

(22) Filed: Feb. 20, 2007

(65) Prior Publication Data

US 2007/0194344 A1 Aug. 23, 2007

(30) Foreign Application Priority Data

Feb. 20, 2006 (KR) .................. 10-2006-0016471

(51) Int. Cl.
*H01L 33/12* (2010.01)
(52) U.S. Cl. .................. 257/103; 257/190; 257/94; 257/E33.03; 438/46
(58) Field of Classification Search .................. 257/213, 257/103, E33.03, 190, 94; 438/46
See application file for complete search history.

(56) References Cited

U.S. PATENT DOCUMENTS

| | | | | |
|---|---|---|---|---|
| 5,130,103 | A * | 7/1992 | Yamagata et al. | 428/209 |
| 6,051,847 | A * | 4/2000 | Oku et al. | 257/94 |
| 6,287,882 | B1 * | 9/2001 | Chang et al. | 438/29 |
| RE38,072 | E * | 4/2003 | Kondo et al. | 438/47 |
| 6,624,442 | B1 * | 9/2003 | Kim et al. | 257/43 |
| 2001/0054717 | A1 * | 12/2001 | Udagawa | 257/82 |
| 2003/0027099 | A1 * | 2/2003 | Udagawa | 433/79 |

* cited by examiner

*Primary Examiner*—Ngan Ngo
*Assistant Examiner*—Benjamin Tzu-Hung Liu
(74) *Attorney, Agent, or Firm*—Birch, Stewart, Kolasch & Birch, LLP

(57) ABSTRACT

Provided is a nitride semiconductor light-emitting device. The device includes a buffer layer, a first conduction type semiconductor layer, an active layer, and a second conduction type semiconductor layer. The buffer layer comprises amorphous metal. The first conduction type semiconductor layer is on the buffer layer, and the active layer is on the first conduction type semiconductor layer. The second conduction type semiconductor layer is on the active layer.

5 Claims, 3 Drawing Sheets

NITRIDE SEMICONDUCTOR LIGHT-EMITTING DEVICE AND METHOD FOR MANUFACTURING THE SAME

The present application claims priority under 35 U.S.C. 119 and 35 U.S.C. 365 to Korean Patent Application No. 10-2006-0016471 (filed on Feb. 20, 2007), which is hereby incorporated by reference in its entirety.

BACKGROUND OF THE INVENTION

1. Field of the Invention

The present invention relates to a nitride semiconductor light-emitting device and a method for manufacturing the same.

2. Description of the Related Art

Representative examples of a related art nitride semiconductor light-emitting device include a GaN-based nitride semiconductor light-emitting device.

Referring to FIG. 1, a related art GaN-based nitride semiconductor light-emitting device includes a buffer layer 2, an n-GaN layer 3, an active layer 4, and a p-GaN layer 5, a magnesium-doped InGaN layer 6, and a magnesium-doped GaN layer 7 sequentially stacked on a sapphire substrate or a SiC substrate 1. Insulating layers are formed on the magnesium-doped GaN layer 7 and the n-GaN layer 3, respectively, and a p-electrode 9 and an n-electrode 10 are formed in the corresponding insulating layers, respectively, so that the nitride semiconductor light-emitting device is formed.

Since the buffer layer formed for realizing the related art nitride semiconductor light-emitting device buffers stress between the substrate and a layer grown on the substrate, technology of growing a buffer layer formed of material such as GaN and AlGaN is applied depending on the kind of the substrate such as a SiC substrate and a Si substrate.

However, when the buffer layer is formed of GaN or AlGaN according to the related art, a lattice constant of a material such as GaN and AlGaN is greater than a lattice constant of a substrate such as a sapphire substrate and a SiC substrate and smaller than a lattice constant of a GaN layer formed on the buffer layer. Accordingly, there occurs a problem that a lattice defect such as dislocation and vacancy is generated between the buffer layer and a layer grown on the buffer layer.

Also, there occurs a problem that stress due to thermal impact is caused by a difference of about 35% in a thermal expansion coefficient between the buffer layer and the substrate, or between the buffer layer and the layer grown on the buffer layer.

SUMMARY OF THE INVENTION

The embodiment of the present invention provides a nitride semiconductor light-emitting device and a method for manufacturing the same that substantially obviate one or more problems due to limitations and disadvantages of the related art.

The embodiment of the present invention provides a nitride semiconductor light-emitting device including an excellent crystal lattice coupling characteristic free of a lattice defect such as lattice mismatch, and a method for manufacturing the same.

Also, the embodiment of the present invention provides a nitride semiconductor light-emitting device including a buffer layer having low stress against a thermal impact and a method for manufacturing the same.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

One embodiment of the present invention provides a nitride semiconductor light-emitting device including: a buffer layer comprising amorphous metal; a first conduction type semiconductor layer on the buffer layer; an active layer on the first conduction type semiconductor layer; and a second conduction type semiconductor layer on the active layer.

Another embodiment of the present invention provides a nitride semiconductor light-emitting device including: a buffer layer comprising amorphous metal; a first conduction type semiconductor layer on the buffer layer; an active layer on the first conduction type semiconductor layer; a second conduction type semiconductor layer on the active layer; a first electrode on a lower surface of the buffer layer; and a second electrode on the second conduction type semiconductor layer.

Another embodiment of the present invention provides a method for manufacturing a nitride semiconductor light-emitting device, the method including: forming a buffer layer on a substrate using amorphous metal; forming a first conduction type semiconductor layer on the buffer layer; forming an active layer on the first conduction type semiconductor layer; and forming a second conduction type semiconductor layer on the active layer.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings.

It will be understood that when a layer (or film) is referred to as being 'on/under' another layer or substrate, it can be directly on/under the other layer or substrate, or intervening layers may also be present.

First Embodiment

Figure 1:
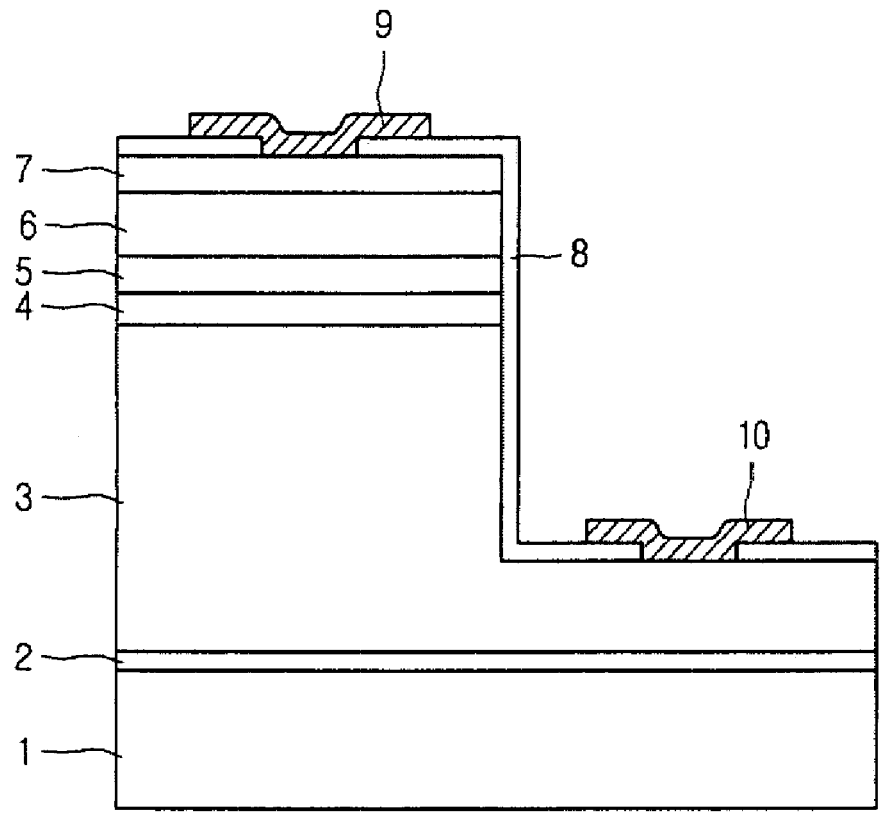
FIG. 1 is a cross-sectional view of a nitride semiconductor light-emitting device according to a related art.
Figure 2:
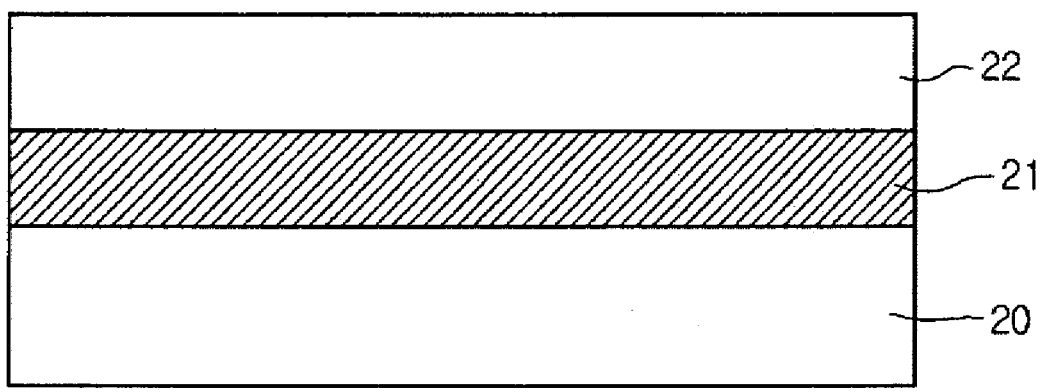
FIGS. 2 to 4 are cross-sectional views illustrating a process in a method for manufacturing a nitride semiconductor light-emitting device according to a first embodiment of the present invention.
Figure 3:
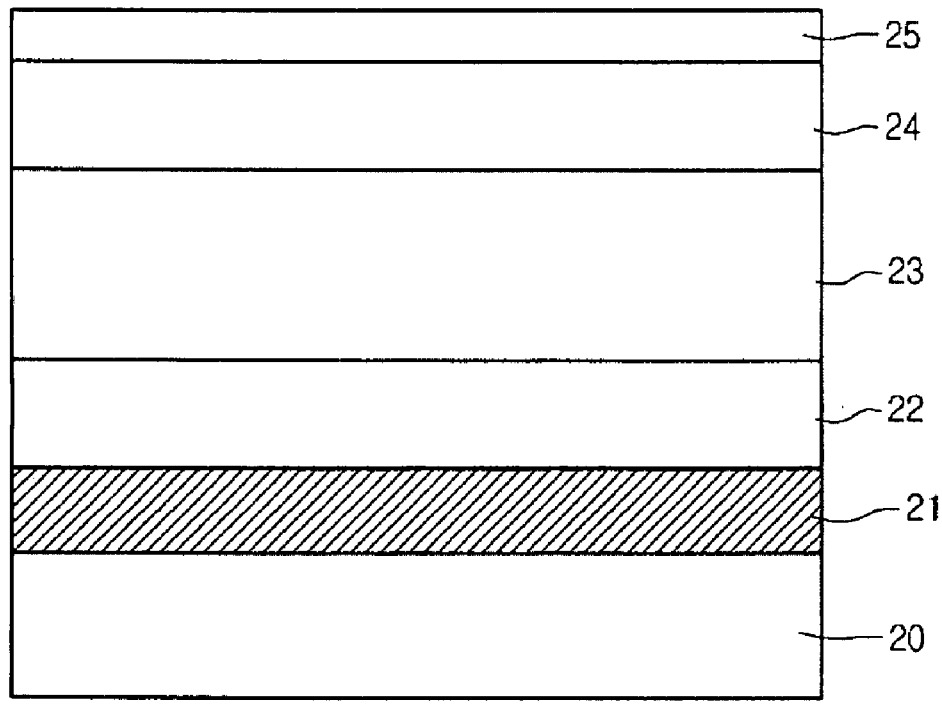
Figure 4:
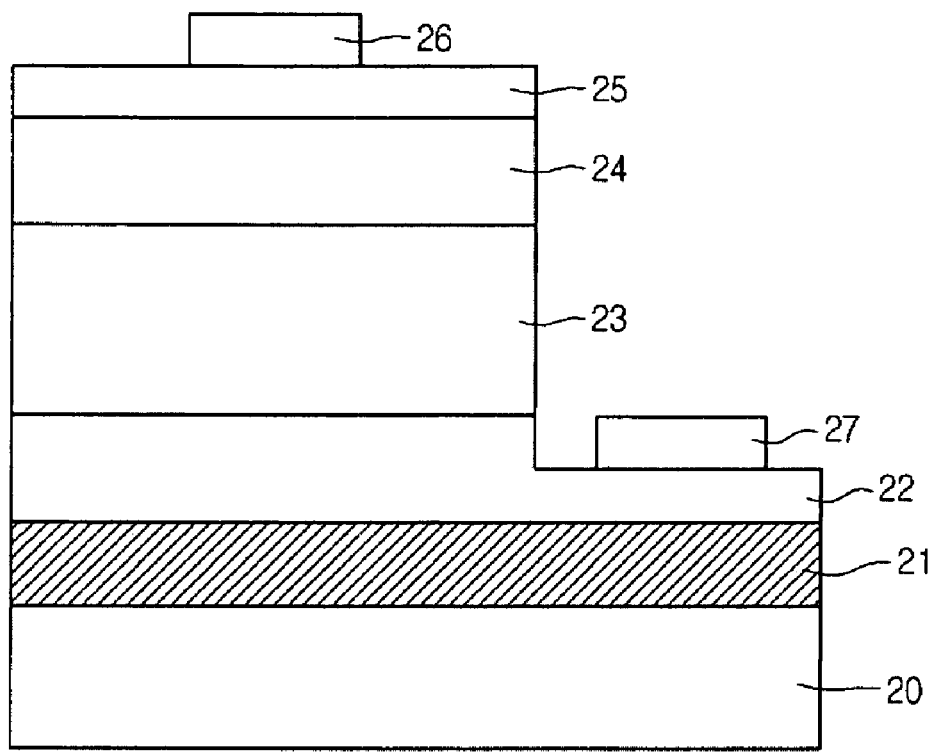

FIGS. 2 to 4 are cross-sectional views illustrating a process in a method for manufacturing a nitride semiconductor light-emitting device according to a first embodiment of the present invention.

First, referring to FIG. 2, a substrate 20 comprising sapphire or SiC is mounted on a sputtering chamber (not shown) for sputtering of physical vapor deposition (PVD) methods, and an amorphous buffer layer 21 is formed according to a first embodiment of the present invention.

The buffer layer 21 includes at least one of Fe-based amorphous alloy metal, Ni-based amorphous alloy metal, and Co-based amorphous alloy metal.

For example, the buffer layer 21 comprises Fe-based amorphous alloy metal according to the first embodiment of the present invention, but is not limited thereto.

That is, according to the first embodiment of the present invention, a Fe—Si—B amorphous buffer layer 21 can be grown to a thickness of about 1-2 μm using an iron alloy formed of Fe—Si—B, including Fe of 73.5%, Si of 20.5%, and B of 6% as a test piece at a growing temperature of about 1400-1600° C. using sputtering of PVD methods.

Also, in the first embodiment of depositing the Fe—Si—B alloy for buffer layer 21 using the sputtering, the buffer layer 21 can be formed by disposing a foil of a Fe—Si—B alloy having a thickness of 1-1.5 μm on the substrate 20, and performing annealing at a temperature range of 400-450° C. for 10-15 minutes.

Also, the buffer layer 21 can be formed by depositing the Fe—Si—B alloy of the first embodiment using evaporation, and performing annealing on the substrate having the Fe—Si—B alloy metal at an atmosphere of about 400-800° C.

When the buffer layer is formed according to the present invention, the buffer layer 21 of the Fe—Si—B alloy is comprising an amorphous material, that is, the buffer layer 21 is coupled in a short-range order, so that lattice mismatch by a difference in a lattice constant between the buffer layer and the substrate 20 is not generated. Accordingly, the present invention not only solves a lattice mismatch problem but also reduces a difference of about 35% (related art) in a thermal expansion coefficient.

Also, when the buffer layer is formed according to the present invention, the buffer layer can provide a reflector effect reflecting light using the properties of Fe, Co, and Ni-based amorphous allies and a function of a frame performing a support function, so that wafer bowling is prevented.

Next, the buffer layer 21 having a flat surface can be finally formed to a thickness of about 0.5-1 μm by performing chemical-mechanical polishing (CMP) and annealing in order to planarize the surface of the buffer layer 21 grown using an iron alloy of Fe—Si—B.

The buffer layer 21 is formed by annealing an alloy metal foil on the substrate 20 at a predetermined temperature.

For example, the alloy metal film provided on the substrate 20 can be annealed at an atmosphere of about 400-800° C.

In detail, the annealing operation includes performing an annealing operation at a temperature range of about 400-430° C. for 10-15 minutes, or performing an annealing operation at a temperature range of about 700-800° C. for less than 1 minute to form the amorphous buffer layer 21.

Next, a silan gas including an n-type dopant such as $NH_3$, $TMG_a$, and Si is supplied on the buffer layer 21 to grow a first conduction type semiconductor layer 22 to a thickness of about 1-3 μm.

Here, the first conduction type semiconductor layer 22 can be formed by growing an n-GaN cladding layer. An undoped GaN layer can be further formed between the buffer layer 21 and the first conduction type semiconductor layer 22.

Next, referring to FIG. 3, an active layer 23 of a multi-quantum well (MQW) including InGaN/InGaN is formed on the first conduction type semiconductor layer 22 using metal organic chemical vapor deposition (MOCVD). At this point, composition of the active layer 23 can have a stacking structure formed by growing InGaN/InGaN with different mol ratio for respective elements.

After the active layer 23 is formed, TMGa, TMAl, EtCp2Mg{Mg($C_2H_5C_5H_4$)$_2$}, and NH3 are supplied on the active layer 23 at an atmosphere of about 900-1100° C. using hydrogen as a carrier gas to grow a second conduction type semiconductor layer 24 to a thickness of about 0.1-0.3 μm. Here, the second conduction type semiconductor layer 24 is formed by growing a p-GaN cladding layer.

After that, a silan gas including an n-type dopant can be supplied on the second conduction type semiconductor layer 24 to additionally form a thin third conduction type semiconductor layer 25, so that a light-emitting device of npn structure can be formed. Here, the third conduction type semiconductor layer 25 is formed by growing an n-GaN cladding layer.

Also, the present invention can realize a light-emitting device of other junction structure such as a pn junction having a stacking structure in which a buffer layer 21, a first conduction type semiconductor layer 22, an active layer 23, and a second conduction type semiconductor layer 24 sequentially stacked on a substrate 20, besides the light-emitting device of the above-described npn structure.

Next, referring to FIG. 4, when the third conduction type semiconductor layer 25 is formed, portions of the second conduction type semiconductor layer 24 and the active layer 23 are partially etched (e.g., anisotropic wet etched) to a predetermined depth to expose a portion of the first conduction type semiconductor layer 22.

When the first conduction type semiconductor layer 22 is exposed, an n-type electrode 27 formed of Ti can be formed on the first conduction type semiconductor layer 22, and a p-type electrode 26 formed of Ni can be formed on the third conduction type semiconductor layer 25.

As described above, the nitride semiconductor light-emitting device and the method for manufacturing the same according to the first embodiment of the present invention solves a problem of a lattice mismatch between the buffer layer and the substrate, or between the buffer layer and the nitride layer formed on the buffer layer. Accordingly, not only a lattice mismatch problem is resolved but also a difference in a thermal expansion coefficient is reduced.

Also, according to the first embodiment of the present invention, a reflector effect reflecting light using the properties of Fe, Co, and Ni-based amorphous allies, and wafer bowling preventing effect using a support function are achieved.

Second Embodiment

Figure 5:
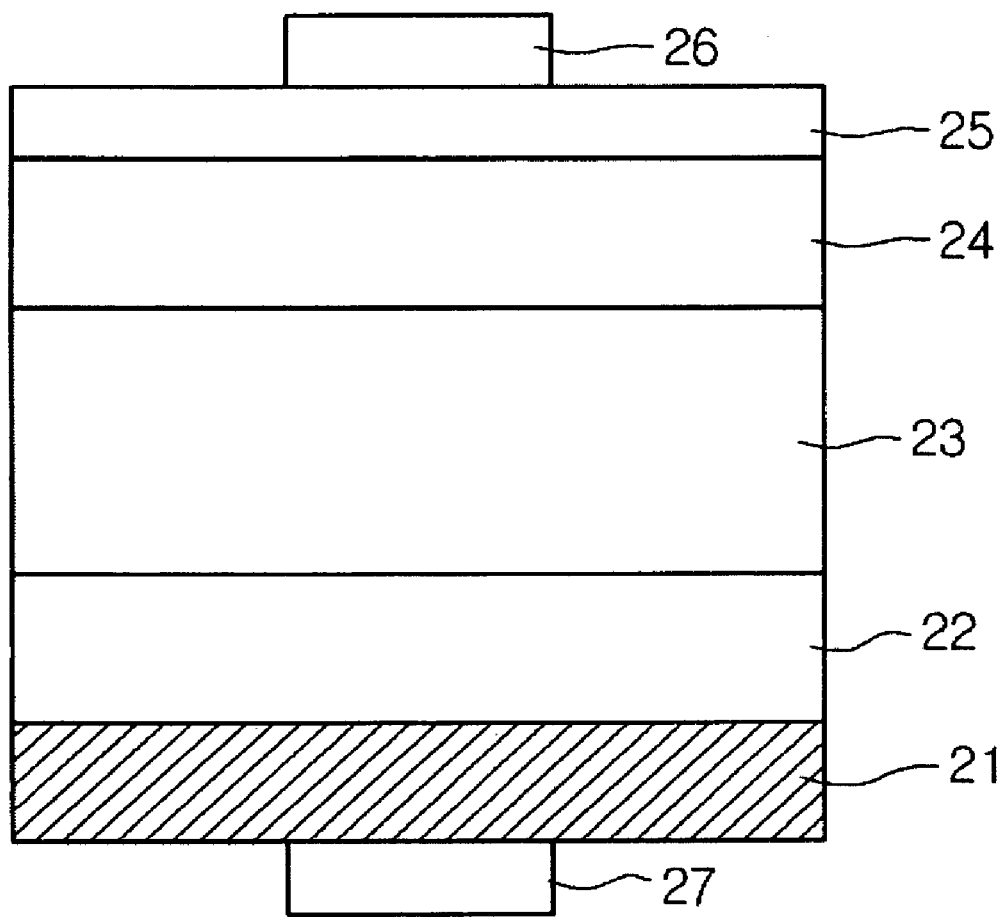
FIG. 5 is a cross-sectional view of a nitride semiconductor light-emitting device according to a second embodiment of the present invention.

FIG. 5 is a cross-sectional view of a nitride semiconductor light-emitting device according to a second embodiment of the present invention.

In a nitride semiconductor light-emitting device according to the second embodiment of the present invention, an operation of etching an active layer 23 and a second conduction type semiconductor layer 24 is not performed when an n-type electrode 27 is formed. Instead, the n-type electrode 27 can be formed on a lower surface of the buffer layer 21. Accordingly, a vertical nitride semiconductor light-emitting device can be realized.

In detail, since the buffer layer 21 is a conductive material, the n-type electrode is formed on the lower surface of the buffer layer 21. For this purpose, the substrate 20 is removed from the buffer layer 21 in the structure illustrated in FIG. 3, the p-type electrode 26 is formed on the third conduction type semiconductor layer 25, and the n-type electrode 27 can be formed on the lower surface of the buffer layer 21.

The second embodiment of the present invention can adopt technical characteristics of the first embodiment of the present invention.

For example, the buffer layer 21 according to the second embodiment of the present invention can be formed of a Fe—Si—B alloy including Fe-based material, and can be formed of a Co—Si—B alloy or a Ni—Si—B alloy including Co or Ni besides a Fe—based material.

Also, in the second embodiment of depositing the Fe—Si—B alloy for buffer layer 21 using the sputtering, the buffer layer 21 can be formed by disposing a foil of a Fe—Si—B alloy having a thickness of 1-1.5 μm on the substrate 20, and performing annealing at a temperature range of 400-450° C. for 10-15 minutes.

After that, as in the above-described first embodiment, a first conduction type semiconductor layer 22, an active layer 23, a second conduction type semiconductor layer 24, a p-type electrode 26, an n-type electrode 27 can be sequentially formed similarly.

When the buffer layer is formed using a material such as GaN and AlGaN, a lattice constant of GaN or AlGaN is greater than that of a substrate of sapphire or SiC, and smaller than that of a GaN layer formed on the buffer layer. Accordingly, a lattice defect problem cannot be solved.

However, when the buffer layer is formed according to the present invention, the buffer layer 21 of the Fe—Si—B alloy is amorphous and does not generate a lattice mismatch caused by a difference in a lattice constant between the buffer layer and the substrate 20. Accordingly, a lattice mismatch problem is solved and a difference of about 35% in a thermal expansion coefficient can be reduced.

Also, the buffer layer can provide a reflector effect reflecting light using the properties of an amorphous buffer layer and perform a function of a frame performing a support function, so that wafer bowling is prevented.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A nitride semiconductor light-emitting device comprising:
    a buffer layer comprising amorphous metal;
    a first conduction type semiconductor layer on the buffer layer;
    an active layer on the first conduction type semiconductor layer; and
    a second conduction type semiconductor layer on the active layer,
    wherein the buffer layer comprises at least one of Fe-based amorphous metal, Ni-base amorphous metal, and Co-based amorphous metal.

2. The device according to claim 1, wherein the Fe-based amorphous metal comprises Fe—Si—B alloy.

3. The device according to claim 1, wherein the Fe-based amorphous metal comprises Fe—Si—B alloy including Fe of 73.5%, Si of 20.5%, and B of 6%.

4. A nitride semiconductor light-emitting device comprising:
    a buffer layer comprising amorphous metal;
    a first conduction type semiconductor layer on the buffer layer;
    an active layer on the first conduction type semiconductor layer;
    a second conduction type semiconductor layer on the active layer;
    a first electrode on a lower surface of the buffer layer; and
    a second electrode on the second conduction type semiconductor layer,
    wherein the buffer layer comprises at least one of Fe-based amorphous metal, Ni-base amorphous metal, and Co-based amorphous metal.

5. A method for manufacturing a nitride semiconductor light-emitting device, the method comprising:
    forming a buffer layer on a substrate using amorphous metal;
    forming a first conduction type semiconductor layer on the buffer layer;
    forming an active layer on the first conduction type semiconductor layer; and
    forming a second conduction type semiconductor layer on the active layer,
    wherein the amorphous metal comprises at least one of Fe-based amorphous metal, Ni-based amorphous metal, and Co-based amorphous metal.

* * * * *